(12) United States Patent
Migita et al.

(10) Patent No.: US 9,941,165 B2
(45) Date of Patent: Apr. 10, 2018

(54) SEMICONDUCTOR MANUFACTURING METHOD

(71) Applicant: Toshiba Memory Corporation, Tokyo (JP)

(72) Inventors: Tatsuo Migita, Oita Oita (JP); Fumito Shoji, Oita Oita (JP); Koji Ogiso, Oita Oita (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/231,717

(22) Filed: Aug. 8, 2016

(65) Prior Publication Data

US 2017/0263499 A1    Sep. 14, 2017

(30) Foreign Application Priority Data

Mar. 14, 2016  (JP) ................................. 2016-050105

(51) Int. Cl.
| | |
|---|---|
| *H01L 21/44* | (2006.01) |
| *H01L 21/768* | (2006.01) |
| *H01L 21/288* | (2006.01) |
| *H01L 21/02* | (2006.01) |
| *H01L 21/67* | (2006.01) |

(Continued)

(52) U.S. Cl.
CPC ......... *H01L 21/76898* (2013.01); *B08B 3/02* (2013.01); *H01L 21/02068* (2013.01); *H01L 21/02244* (2013.01); *H01L 21/288* (2013.01); *H01L 21/67051* (2013.01);
(Continued)

(58) Field of Classification Search
CPC .......... H01L 21/67028; H01L 21/6708; H01L 21/30625; H01L 21/6715; H01L 21/67219; H01L 21/67379; H01L 21/76879; H01L 21/76846; H01L 21/76831; H01L 21/687; H01L 21/67051; H01L 21/288;
(Continued)

(56) References Cited

U.S. PATENT DOCUMENTS

| | | | |
|---|---|---|---|
| 6,287,178 B1* | 9/2001 | Huynh ...................... | B08B 3/02 239/556 |
| 6,361,599 B1* | 3/2002 | Marinaro ............ | H01L 21/6708 118/315 |

(Continued)

FOREIGN PATENT DOCUMENTS

JP     2002-305174 A     10/2002

*Primary Examiner* — Mohammed Shamsuzzaman
(74) *Attorney, Agent, or Firm* — Patterson & Sheridan, LLP

(57) ABSTRACT

A semiconductor manufacturing method includes forming a first metal film on a semiconductor wafer by plating, ejecting liquid from a washer bar spaced from the wafer while rotating at least one of the washer and the semiconductor, and forming a second metal film on the first metal film. A plurality of nozzles are located on the washer bar and displaced from the position of the washer bar opposed to the center of the wafer, and a greater number of nozzles are adjacent the peripheral area of the semiconductor wafer than the central area of the semiconductor wafer. The nozzles in the peripheral area of the wafer eject the washing liquid in a direction inclined from the direction of the washer bar, and a nozzle arranged on the central area of the one main surface of the semiconductor wafer ejects the washing liquid towards the center position of the semiconductor wafer.

10 Claims, 5 Drawing Sheets

(51) Int. Cl.
*H01L 21/687* (2006.01)
*B08B 3/02* (2006.01)

(52) U.S. Cl.
CPC ...... *H01L 21/687* (2013.01); *H01L 21/76831* (2013.01); *H01L 21/76846* (2013.01); *H01L 21/76879* (2013.01)

(58) Field of Classification Search
CPC ......... H01L 21/02244; H01L 21/02068; H01L 21/76898; B08B 3/02
USPC .............................. 257/774; 438/667; 451/73
See application file for complete search history.

(56) References Cited

U.S. PATENT DOCUMENTS

| | | | |
|---|---|---|---|
| 6,659,116 B1 * | 12/2003 | Williams | B08B 3/02 134/176 |
| 7,767,025 B2 * | 8/2010 | Ramanan | B08B 3/022 134/15 |
| 8,177,993 B2 * | 5/2012 | Seah | H01L 21/67028 134/1.3 |
| 8,592,310 B2 | 11/2013 | Park et al. | |
| 9,054,081 B2 | 6/2015 | Nakamura et al. | |
| 2010/0038778 A1 | 2/2010 | Lee et al. | |
| 2015/0214134 A1 | 7/2015 | Ogiso et al. | |
| 2016/0111372 A1 * | 4/2016 | Lu | H01L 21/76831 257/774 |

* cited by examiner

SEMICONDUCTOR MANUFACTURING METHOD

CROSS-REFERENCE TO RELATED APPLICATION

This application is based upon and claims the benefit of priority from Japanese Patent Application No. 2016-050105, filed Mar. 14, 2016, the entire contents of which are incorporated herein by reference.

FIELD

An embodiment of the present invention relates to a semiconductor manufacturing method.

BACKGROUND

A technique is known in which chips on or in which a semiconductor element or an integrated circuit is formed are stacked as multiple layers on a substrate to reduce the surface area of a resulting semiconductor device. In order to achieve electrical conduction between the stacked chips, a through electrode called a TSV (Through Silicon Via) may be formed.

Embedding metal into a via hole is generally performed by a plating treatment such as electroplating on an opening in a wafer to form a through electrode. In the plating treatment of the through electrode, in order to improve the electrical conductivity and durability, a plurality of metals may be stacked in the through electrode. In this case, after a layer of metal film is immersed in a plating liquid and is formed, the surface of the metal film is washed with water to remove the plating liquid, and then, an additional metal film is formed on the previously formed metal film by immersing the wafer and thus the previously formed metal film of the partially formed through electrode in the next plating liquid.

However, when the surface of the metal film is washed with water to remove the plating liquid between the plating treatments, an oxide film is formed on the surface of the metal film. Therefore, the next metal film must be formed after the oxide film is removed by some means, but it may be difficult to remove the oxide film depending on composition of the metal forming the metal film. In this case, a new metal film is formed by a plating treatment on the oxide film, but the contact performance between the oxide film and the metal film is not good, and thus a failure resulting from inadequate or incomplete plating of the next metal layer, or inadequate contact between the second and first metal layers, may occur.

DETAILED DESCRIPTION

According to an embodiment, there is provided a semiconductor manufacturing method that that reduces the incidence of inadequate or incomplete subsequent plating.

In order to solve the aforementioned problems, in general, according to one embodiment of the present invention, a semiconductor manufacturing method includes:

forming a first metal film on one main surface of a semiconductor wafer by a first plating treatment;

ejecting, from a washer bar spaced from the one main surface, a washing liquid onto the one main surface of the semiconductor wafer, while rotating at least one of the washer and the semiconductor wafer to wash the surface of the first metal film; and forming a second metal film on the first metal film by a second plating treatment, wherein a plurality of nozzles are located on the washer bar in a single direction, the plurality of nozzles are displaced from the position of the washer bar opposed to the center of the one main surface of the semiconductor wafer, and a greater number of nozzles are located adjacent the peripheral area of the one main surface of the semiconductor wafer than are adjacent to the central area of the semiconductor wafer, the nozzles located in the peripheral area of the semiconductor wafer eject the washing liquid in a first range in a direction inclined from the one direction, and one of the nozzles located in the central area of the one main surface of the semiconductor wafer ejects the washing liquid in a second range including the center position of the semiconductor wafer.

An embodiment of the present invention will be described below in detail. According to the present embodiment, various electrodes such as a through electrode, a bump electrode and a contact formed on a semiconductor wafer are formed by a plating treatment. More particularly, in the present embodiment, the various electrodes are formed by sequentially forming a stack of a plurality of metal films by a plating treatment. When a plurality of metal films are to be stacked by a plating treatment, the process is repeated in which after a layer of metal film is formed by a plating treatment, a washing step for washing the surface of the metal film with water is performed, and then, the next layer of metal film is formed over the previous layer of metal by a plating treatment.

Figure 1:
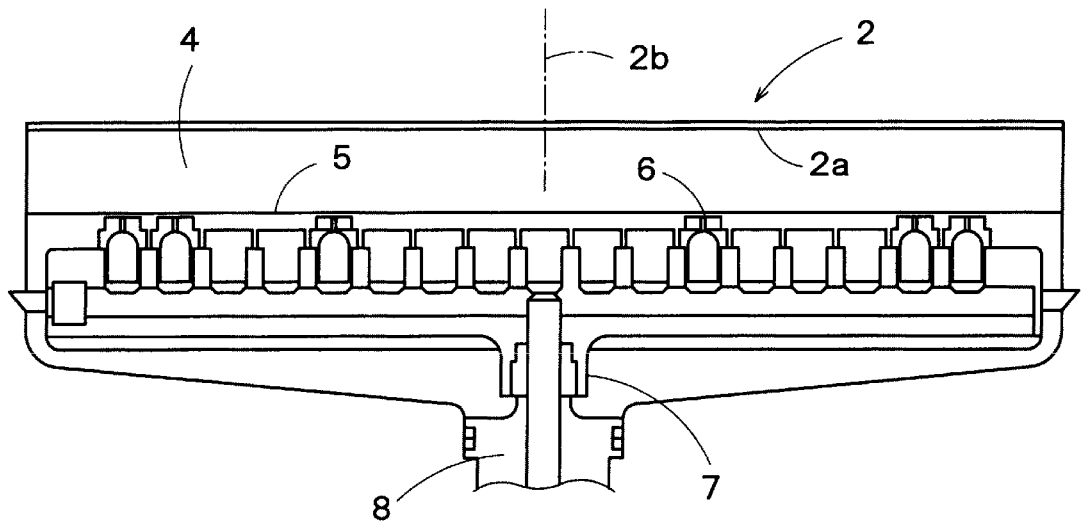
FIG. 1 is a cross-sectional view of a washing device to be used in a washing process.

FIG. 1 is a cross-sectional view of a washing device 1 to be used in a washing process of a wafer described above. A semiconductor wafer 2 is fixed to a washing device 1 in FIG. 1 so that a surface to be washed 2a faces down. The surface to be washed 2a is one main surface on which a through electrode and a bump electrode are formed.

The semiconductor wafer 2 is supported by a support mechanism located on the edge of the front and back sides thereof in FIG. 1, but the support mechanism is not shown in FIG. 1. An upper cover, not shown, is arranged on the upper portion of the semiconductor wafer 2 to seal the semiconductor wafer 2 in a washing chamber 4 shown so as not to splash water outside the washing device 1 when the semiconductor wafer 2 is washed.

A linear washer bar 5 extending in one direction is arranged below the surface to be washed 2a. A gap is provided between the semiconductor wafer 2 and the washer bar 5. A plurality of nozzles 6 are provided on the washer bar 5 in locations spaced along the one direction. Each nozzle 6 ejects a washing liquid (e.g., water) upwardly therefrom to wash the surface 2a of the semiconductor wafer 2 to be washed which is located opposed thereto.

A rotation shaft 7 and a rotation driving unit 8 are mounted on the center portion in the longitudinal direction (one direction) of the washer bar 5, and the washer bar 5 is rotatable around the rotation shaft 7. That is, the washer bar 5 rotates along the surface to be washed 2a while keeping a constant distance from the surface to be washed 2a of the semiconductor wafer 2.

The semiconductor wafer 2 is positioned and fixed such that a normal line 2b of the center position substantially corresponds to the center of the rotation shaft 7 of the washer bar 5. Thus, the washer bar 5 rotates such that the washer bar 5 spins around the center position of the semiconductor wafer 2. While rotating, the washer bar 5 ejects water from each nozzle 6 to the surface 2a of the semiconductor wafer 2 to be washed to wash the entire surface 2a to be washed. Note that the semiconductor wafer 2 may rotate while the washer bar 5 is held fixed, or both of the washer bar 5 and the semiconductor wafer 2 may rotate as long as the rotation shaft 7 causes the portions of the washer bar 5 extending from both sides of the shaft 7 to relatively pass or sweep around the center position of the semiconductor wafer 2.

A water supply pipe, not shown, for supplying water to each nozzle 6, a discharge pipe, not shown, for discharging water after washing, a power supply cable, not shown, for supplying power to the rotation driving unit 8 and the like are mounted on the washer bar 5.

Although the entire length of the washer bar 5 in a longitudinal direction washer bar 5 is slightly smaller than the diameter of the semiconductor wafer 2, as will be described later, each nozzle 6 ejects a uniform amount of water in a predetermined angular range, therefore, it is possible to wash the entire surface 2a to be washed of the semiconductor wafer 2.

The washer bar 5 according to the embodiment enables uniform washing of the entire surface 2a with a uniform amount of water. This feature is achieved by the arrangement of the nozzles 6 of the washer bar 5 and the ejection direction of the water from the nozzles 6. Note that, although the amount of water per unit time ejected from each nozzle 6 is adjustable, the amount of water is not intended to be adjusted independently for each of the nozzles 6, but is intended to be adjusted for all the nozzles 6.

Figure 2:
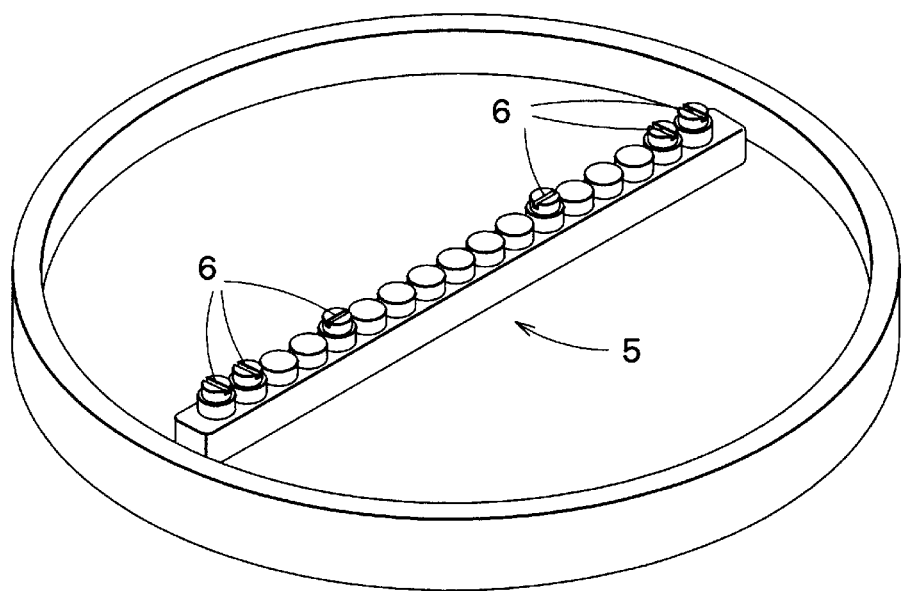
FIG. 2 is a diagram showing the arrangement of nozzles of a washer according to the present embodiment.
Figure 3:
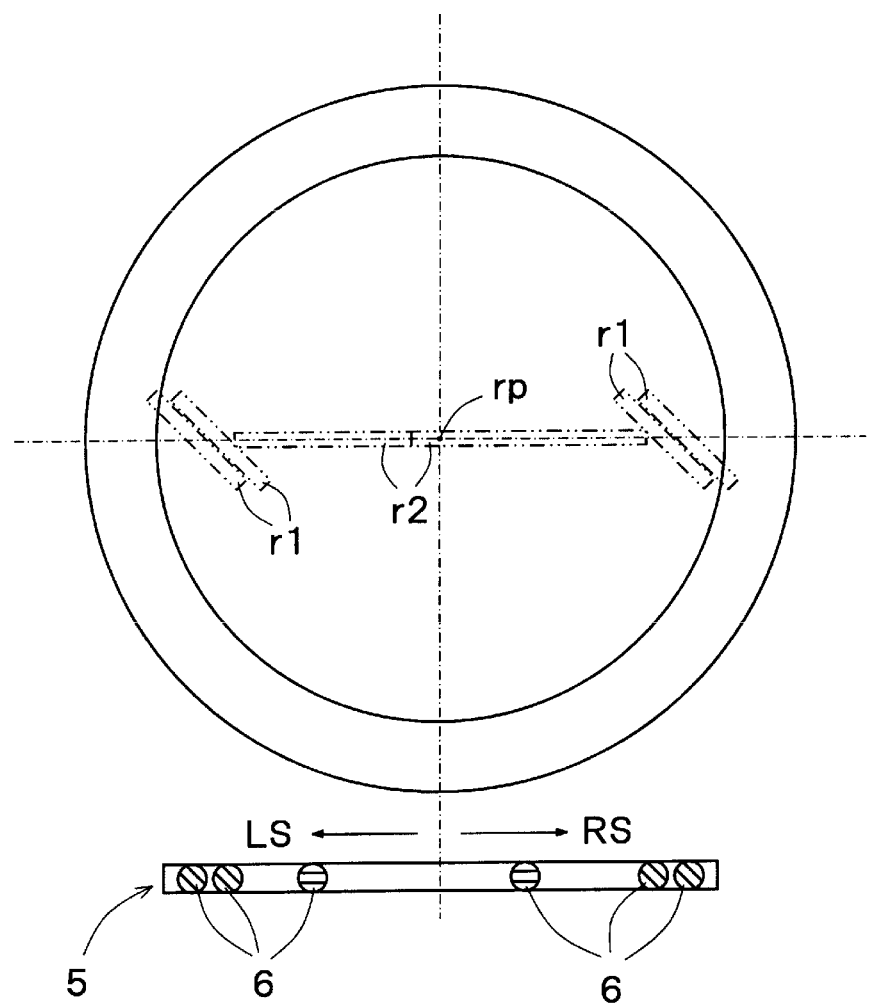
FIG. 3 is a diagram showing an ejection range of water ejected from each nozzle of FIG. 2.

FIG. 2 is a diagram showing the arrangement of the nozzles 6 of the washer bar 5 according to the present embodiment, and FIG. 3 is a diagram showing the ejection range of water ejected from each nozzle 6 of FIG. 2. A plurality of nozzles 6 are arranged at irregular intervals on the upper surface of the washer bar 5, i.e., the surface thereof facing the surface 2a of the semiconductor wafer 2 to be washed. More specifically, none of the plurality of nozzles 6 are positioned to directly face the center of the semiconductor wafer 2. In the example of FIGS. 2 and 3, assuming that the center of the rotation shaft 7 arranged in the center in the longitudinal direction of the washer bar 5 is taken as a reference point rp, the same number of nozzles 6, that is, three nozzle 6 are located on one side LS and the other side RS of location rp respectively. Two among three nozzles 6 on one side LS are located to the periphery side of the semiconductor wafer 2, and the remaining one nozzle 6 is located toward the center of the semiconductor wafer 2 from the two nozzles located to the periphery of the semiconductor wafer 2. Similarly, two among three nozzles 6 on the other side RS are located to the periphery side of the semiconductor wafer 2, and the remaining one nozzle 6 is located toward the center of the semiconductor wafer 2 from the two nozzles located to the periphery of the semiconductor wafer 2.

Here, the reference point rp represents the center of the rotation shaft 7 of the washer bar 5; ideally, the point rp intersects a line 2b normal to the substrate passing through the center position rp of the semiconductor wafer 2.

As shown in FIG. 3, among the three nozzles 6 arranged on the one side LS from the reference point rp, two nozzles 6 on periphery side of the semiconductor wafer 2 eject water in a first ejection range r1 against the underside of the semiconductor wafer 2 and thus surface 2a in a direction inclined from the longitudinal direction (one direction) of the washer bar 5, and the remaining one nozzle 6 closer to the center of the wafer 2 ejects water against the underside of the semiconductor wafer in a second ejection range r2 in the longitudinal direction of the washer bar 5. Likewise, among the three nozzles 6 arranged on the other side RS of the washer bar 5 from the reference point rp, two nozzles 6 on the periphery side of the semiconductor wafer 2 eject water in a first ejection range r1 against the underside of the semiconductor wafer 2 and thus surface 2a in a direction inclined from the longitudinal direction of the washer bar 5, and the remaining one nozzle 6 closer to the center of the semiconductor wafer 2 ejects water against the underside of the semiconductor wafer 2 in a second range r2 extending in the longitudinal direction of the washer bar 5. Among the two second water ejection ranges r2, at least one of the second ranges r2 of the nozzles 6 includes the reference point rp. Thus, each nozzle 6 ejects water to the surface to be washed 2a of the semiconductor wafer 2 in a substantially linear fan shape. Six rectangular regions r1, r2 shown in FIG. 3 schematically show the ejection ranges of the water from each nozzle 6.

Further, on both of the one side LS and the other side RS from the reference point rp, ejection directions of water from two each of nozzles 6 to the periphery side of the semiconductor wafer 2 are parallel to each other. That is, two each of nozzles 6 on the periphery side eject water in a direction inclined by the same angle from one direction. This can prevent the collision of water streams ejected from different nozzles 6 and allow a uniform amount of water reaching the surface 2a of the semiconductor wafer 2 to be washed regardless of the location. When the water streams from a plurality of nozzles 6 collide with each other, water splashes irregularly on the surface 2a to be washed 2a, and variations in the amount of water reaching the surface 2a to be washed can become large, depending on the location on surface 2a. However, in the present embodiment, the amount of water reaching each area of the water can be uniformed.

Further, on both of the one side LS and the other side RS from the reference point rp, the ejection ranges of the water ejected from one each of nozzles 6 to the center side of the semiconductor wafer 2 slightly overlap with each other. Furthermore, in both of the one side LS and the other side RS from the reference point rp, the ejection range of water from the one nozzle 6 close to the center of the washer bar 5 only slightly overlaps with the ejection ranges of water from two nozzles 6 on the periphery side. Thus, it is possible to narrow the range as much as possible where the water ejected from a plurality of nozzles 6 overlap, thereby reducing variations in the amount of water adhering to the surface 2a to be washed of the semiconductor wafer 2, depending on the location thereon. Additionally, of the nozzles 6, those to either side of the reference point rp and facing the peripheral area of the wafer 2 may be symmetrically disposed about the reference point rp, and those nozzles to either side of the reference point rp and facing the central area of the wafer 2 are asymmetrically disposed about the reference point rp.

Figure 4:
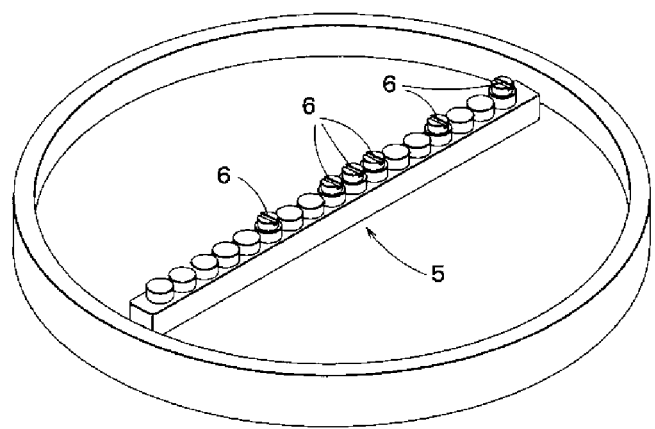
FIG. 4 is a diagram showing the arrangement of the nozzles of the washer according to a comparative example.
Figure 5:
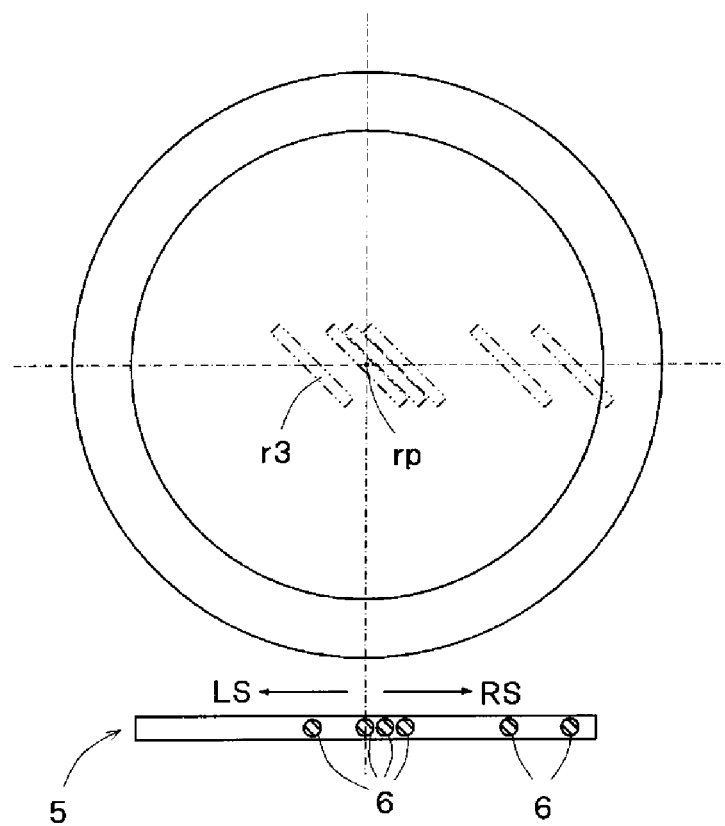
FIG. 5 is a diagram showing an ejection range of water ejected from each nozzle of FIG. 4.

FIG. 4 is a diagram showing the arrangement of the nozzles 6 of the washer bar 5 according to a comparative example, and FIG. 5 is a diagram showing an ejection range of water ejected from each nozzle 6 of FIG. 4. In the example of FIG. 4, more nozzles 6 are located under the center region of the semiconductor wafer 2 than under the periphery area thereof. In addition, more nozzles 6 are located on the side RS from the reference point rp located in the center in the longitudinal direction of the washer bar 5 than are on the side LS. Further, as shown in FIG. 5, each nozzle 6 ejects water in a predetermined range r3 along the direction inclined from the longitudinal direction of the washer bar 5.

Thus, according to the washer bar 5 in one comparative example, the amount of water reaching the center region of the surface 2a to be washed of the semiconductor wafer 2 is greater than that reaching the peripheral region of the semiconductor substrate 2. Further, since the ejection range direction of water from each of the respective nozzles 6 is the same, and the respective nozzles 6 are irregularly arranged along the longitudinal direction of the washer bar 5, the amount of water reaching the surface 2a to be washed greatly fluctuates depending on the location. Thus, when there is a via to be subjected to a plating treatment near the center of the surface to be washed 2a where the amount of water is large, a thick oxide film is formed on the surface of the plated metal film in the via, and thus, the contact performance with a new metal film formed in the subsequent plating treatment of that via is deteriorated.

As in one comparative example, as long as more nozzles 6 are located to reach the center region of the semiconductor wafer 2, it is difficult to uniformly apply the amount of water to the surface 2a to be washed 2a regardless of the location thereon. Therefore, in the embodiment, no nozzle 6 is arranged directly under the center, or the area immediately adjacent to the center, of the semiconductor wafer 2. Further, the streams of water ejected from respective nozzles 6 are prevented from colliding with each other.

By using the washing device 1 according to the embodiment, the entire surface of the metal film formed by a plating treatment can be washed with a moderate and uniform amount of water regardless of the location thereof on the wafer side 2a to be washed. Thus, excess water will not adhere to a part of the surface of the metal film, and a thick oxide film is not formed on the surface of the metal film.

Therefore, even when a sequential plurality of metal films are formed by a plating treatment, to the extent that no thick oxide film is formed, after each metal film is formed, the surface of the metal film formed on the uppermost surface can be moderately washed, thus, adhesion to the metal film formed by the plating treatment in the next step is increased. Therefore, according to the embodiment, a through electrode, a bump electrode, a contact electrode and like where a plurality of metal films are stacked may be manufactured with reliable high quality.

Figure 6:
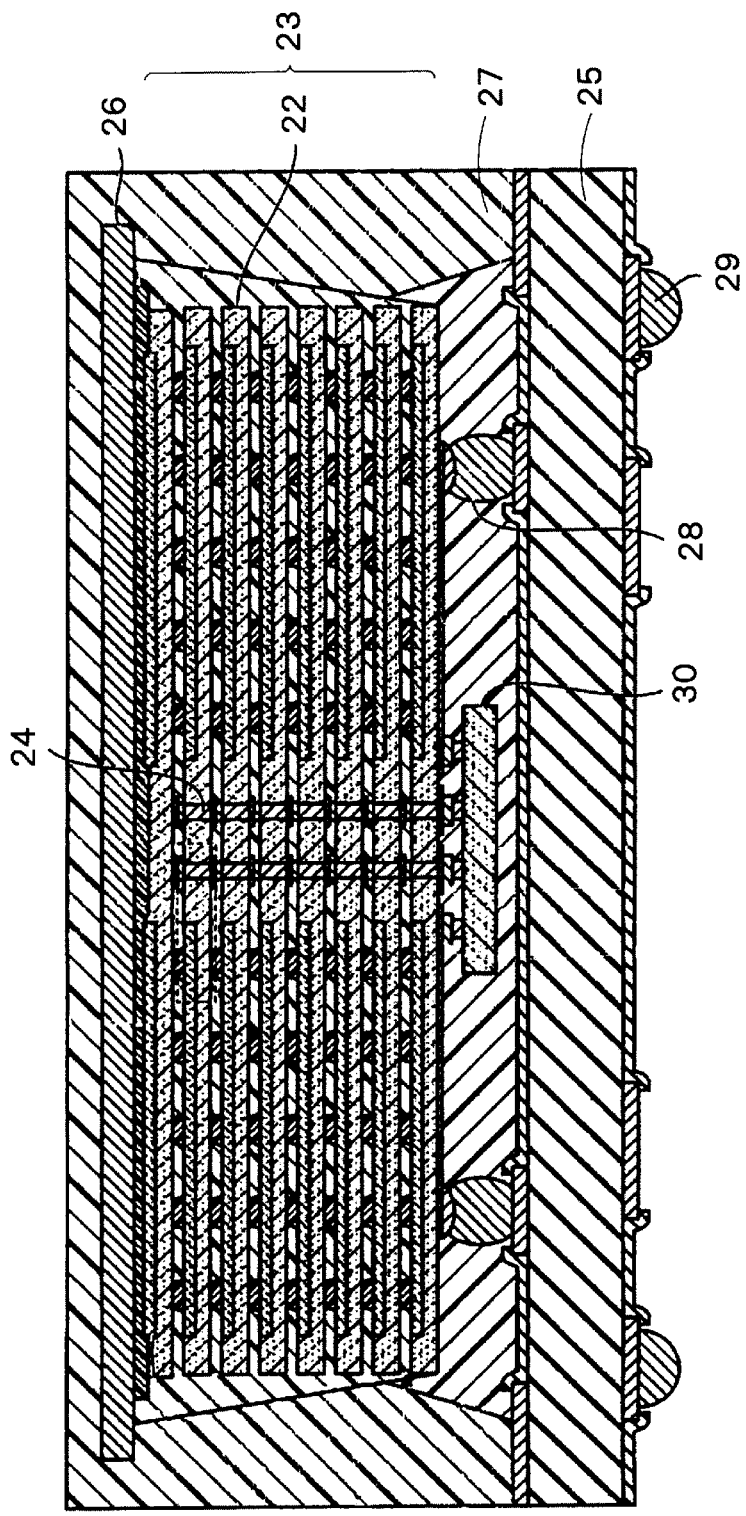
FIG. 6 is a cross-sectional view showing a schematic structure of a semiconductor device manufactured by partially using a semiconductor manufacturing method according to the present embodiment.

FIG. 6 is a cross-sectional view showing a schematic structure of a semiconductor device 21 manufactured by partially using a semiconductor manufacturing method according to the present embodiment. In FIG. 6, a chip stack body 23 where a plurality of semiconductor chips 22 are stacked, a through electrode 24 penetrating the chip stack body 23, a mounting substrate 25 on which the chip stack body 23 is mounted and a supporting substrate 26 supporting the chip stack body 23 are provided. The mounting substrate 25 and the supporting substrate 26 are opposed to each other, the chip stack body 23 is located between the mounting substrate 25 and the supporting substrate 26, and the supporting substrate 26 and the periphery of the chip stack body 23 is covered with a resin 27.

The semiconductor chip 22 is, for example, a NAND flash memory chip, but there is no restriction on the kind thereof. The chip stack body 23 is flip-chip mounted on the mounting substrate 25 via a protruding electrode 28. A protruding electrode 29 is located on the back side of the mounting substrate 25. An interface chip 30 is arranged below the stacked through electrode 24.

At least one of the through electrode 24 and the protruding electrodes 28 and 29 may be made by a plating treatment by using the semiconductor manufacturing method according to the embodiment.

Figure 7:
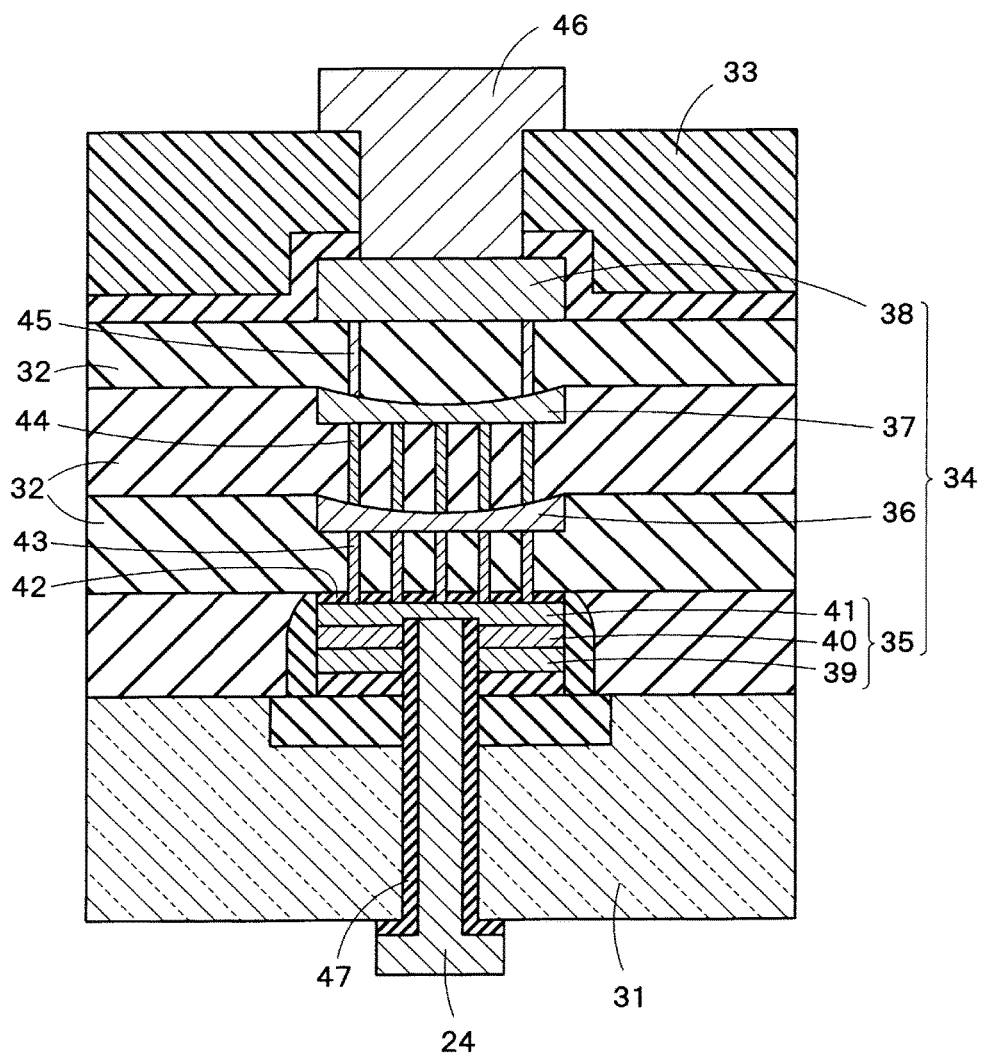
FIG. 7 is a cross-sectional view of a through electrode shown in FIG. 6.

FIG. 7 is a cross-sectional view of the through electrode shown in FIG. 6, and shows a cross-sectional structure of the through electrode 24 provided in one semiconductor chip 22 that is included in the chip stack body 23 in FIG. 6.

The semiconductor chip 22 includes a semiconductor substrate 31, an interlayer insulating film 32 arranged thereon, and a protective film 33 arranged thereon. When the semiconductor chip 22 is a NAND flash type memory chip, a memory cell and a peripheral circuit are separately arranged in the interlayer insulating film 32.

The through electrode 24 is formed so as to penetrate, i.e., extend through, the semiconductor substrate 31. A multilayer wiring layer 34 is arranged in the interlayer insulating film 32. Arranged upwardly from the semiconductor substrate 31 side, the multilayer wiring layer 34 includes a bottom layer connection wiring layer 35, a lower layer connection wiring layer 36, an upper layer connection wiring layer 37 and a top layer connection wiring layer 38.

The bottom layer connection wiring layer 35 has a stack structure, in which, in the direction upwardly from the semiconductor substrate 31 side, a first conductive layer 39, a second conductive layer 40 and a third conductive layer 41 are sequentially stacked. The upper surface of the third conductive layer 41 is in contact with a cap insulating layer 42, and the third conductive layer 41 and the lower layer connection wiring layer 36 are electrically connected by a plurality of contacts 43 penetrating the cap insulating layer 42 and the interlayer insulating film 32.

Similarly, the lower layer connection wiring layer 36 and the upper layer connection wiring layer 37 are electrically connected by a plurality of contacts 44 penetrating the interlayer insulating film 32. Further, the upper layer connection wiring layer 37 and the top layer connection wiring layer 38 are electrically connected by a plurality of contacts 45 penetrating the interlayer insulating film 32. The top layer connection wiring layer 38 is in contact with a surface electrode 46 penetrating the protective film 33.

The through electrode 24 is arranged in a via hole penetrating the semiconductor substrate 31. The sidewall of the via hole is covered with a sidewall insulating film 47. A metal film is formed on top of the sidewall insulating film 47 by the above-mentioned plating treatment. As a plating treatment, by performing a so-called conformal plating, it is possible to grow a metal film from both the bottom side and the side wall of the via hole. Thus, the via hole can be filled with a metal film in a short time. However, using this method, a seam-like space extending in the stacking direction (depth direction of the via) may be formed in the center portion of the via hole, and by using conformal plating, the upper side of the space can be reliably closed with the metal film, thus, even when a space remains inside the via hole, there is no fault in the electrical characteristics.

The material of the metal film in the via hole is, for example, Ni. The upper portion of the through electrode 24 is in contact with the third conductive layer 41. In the vicinity of the contact portion with the third conductive layer 41 of the through electrode 24, a metal film of, for example, copper may be formed by a plating treatment, and a metal film of, for example, tin may be formed thereon by a plating treatment.

Thus, when the through electrode 24 is subject to a plating treatment to form a stacked structure of, for example, nickel, copper and tin, after each metal film is formed, by using the washing device 1 described above, a plating liquid adhering to the surface of the metal film is washed away. By the semiconductor manufacturing method according to the present embodiment, the water from the washer bar 5 does not excessively adhere to the surface of the metal film at any location on the surface 2a of the semiconductor wafer as compared to other locations on the surface 2a, and thus a thick oxide film is not formed on the surface of the metal film. Therefore, it is possible to improve the contact performance between metal films forming the through electrode 24.

Note that when the semiconductor device 21 is manufactured, after the through electrode 24 is formed, there is a step of performing a heat treatment. This heat treatment can cause a crack to form in the metal film in a location thereof between the space in the through electrode 24 and the sidewall insulating film 47, and, for example, the conductive performance of the through electrode 24 is reduced, whereby the reliability of the through electrode 24 may be reduced. In order to prevent a crack, thickness of the metal film may be increased, but the diameter of the via hole for the through electrode 24 cannot be enlarged because of miniaturization.

When the present inventor variously changed the thickness ratio of the deposited metal film layer to the via (TSV) diameter for the through electrode 24 without considering the thickness of the insulating film, and examined the minimum percentage where no crack is formed, it was found to be 15.6%. Note that this value is obtained by performing verification in a state in which the semiconductor device 21, where the through electrode 24 is formed, has been packaged. If the ratio is 15.6% or higher, even though a heat treatment is performed, no crack is formed in the metal film, thereby improving the reliability of the through electrode 24.

As described above, in the present embodiment, when a plurality of metal films are formed in a stack configuration by a plurality of sequential plating treatments, each time a metal film is formed on the semiconductor wafer 2, the entire surface 2a to be washed of the semiconductor wafer 2 is washed with a uniform, moderate, quantity of water. Therefore, before the next plating step, no thick oxide film is formed on the surface of the metal film. Thus, contact performance between metal films is increased. Thus, for example, when a plurality of metal films are stacked in the via hole, a so-called conformal plating may be performed. Thus, it is possible to stack a plurality of metal films in a short time.

More specifically, in the embodiment, a linear washer bar 5 is provided which extends in one direction of the semiconductor wafer 2, the entire length in the longitudinal direction of which is smaller than the diameter of the semiconductor wafer 2. The nozzles 6 of the washer bar 5 are arranged as shown in FIG. 3, thus, it is possible to wash the entire surface to be washed of the semiconductor wafer 2 with a uniform, moderate, quantity of water.

Further, in the present embodiment, when a metal film is formed in the via hole, the ratio of the thickness of the metal film to the diameter of the via hole is set as 15.6% or higher. Thus, it is possible to prevent a problem that a crack is formed in the metal film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing method, comprising:
   forming a first metal film on one main surface of a semiconductor wafer by a first plating treatment;
   ejecting, from a washer bar spaced from the one main surface of the semiconductor wafer, a washing liquid onto the one main surface of the semiconductor wafer, while rotating at least either one of the washer bar and the semiconductor wafer to wash a surface of the first metal film;
   forming a second metal film on the first metal film by a second plating treatment, wherein a plurality of nozzles are located along the washer bar in a single direction; and
   forming an insulating film on an inner wall portion of a hole extending through the semiconductor wafer, wherein
   the plurality of nozzles are displaced from a position of the washer bar located opposed to a center of the one main surface of the semiconductor wafer, and a greater number of nozzles are located adjacent to the peripheral area of the one main surface of the semiconductor wafer than are located adjacent to central area of the semiconductor wafer,
   the nozzles located on the peripheral area of the one main surface of the semiconductor wafer eject the washing liquid in a first range along a direction inclined from one direction of the washer bar,
   one of the nozzles located opposed to the central area of the one main surface of the semiconductor wafer ejects the washing liquid in a second range including the center of the semiconductor wafer,
   the first metal film is formed by the first plating treatment on an inner side of the insulating film, and the second metal film formed by the second plating treatment is on an outer side of the insulating film, and
   a ratio of a film thickness of the first metal film in the hole to a diameter of the hole is 15.6% or greater.

2. The semiconductor manufacturing method according to claim 1, wherein
   the one direction is a direction that intersects a normal line passing through the center of the one main surface of the semiconductor wafer, and extends in a direction parallel to the one main surface of the semiconductor wafer.

3. The semiconductor manufacturing method according to claim 2, wherein
   the same number of nozzles are located on the washer bar on one side of the normal line passing through the center position of the semiconductor wafer as are located on the other side of the normal line passing through the center position of the semiconductor wafer.

4. The semiconductor manufacturing method according to claim 3, wherein
two or more nozzles are located to face the peripheral area of the one main surface of the semiconductor wafer on both sides of the normal line along the one direction, and each of the two or more nozzles on each side of the normal line ejects the washing liquid in a first range inclined at the same angle from the one direction.

5. The semiconductor manufacturing method according to claim 1, wherein
the washer rotates around a rotation axis extending through the semiconductor wafer, and
the semiconductor wafer is held fixed.

6. The semiconductor manufacturing method according to claim 1, comprising the steps of:
ejecting a washing liquid onto the one main surface from the washer after the second metal film is formed, while rotating at least one of the washer or the semiconductor wafer about an axis extending through the semiconductor wafer to wash the surface of the second metal film; and
forming a third metal film on the second metal film by a second plating treatment.

7. A method of metallizing a plurality of through silicon vias in a semiconductor wafer, comprising:
forming an insulating layer to cover sidewalls of the vias; and
plating a plurality of conductive films on the insulating layer formed on the sidewalls of the vias, wherein
a first metal film of the plurality of conductive films is formed by a first plating treatment on an inner side of the insulating layer and other metal films of the plurality of conductive films are formed by other plating treatments in a stacked manner on an outer side of the insulating layer, and
a ratio of a film thickness of a conductive film in the via to a diameter of the via is 15.6% or greater.

8. The method of claim 7, wherein, after plating each conductive film, washing the surface of the semiconductor wafer with a uniform quantity of liquid across the surface thereof to remove plating material adhered thereto.

9. The method of claim 8, wherein during the washing of the surface, a uniform oxidation layer is formed on the conductive film.

10. The method of claim 8, wherein the conductive film comprises at least one of nickel, copper and tin.

* * * * *